(12) United States Patent
Ross et al.

(10) Patent No.: US 6,383,298 B1
(45) Date of Patent: May 7, 2002

(54) METHOD AND APPARATUS FOR PRESSURE MEASUREMENT IN A CVI/CVD FURNACE

(75) Inventors: Roger A. Ross, Chino Hills, CA (US); Patrick C. Trujillo, Pueblo West, CO (US); Robert Fiala, Spokane, WA (US)

(73) Assignee: Goodrich Corporation, Becksville, OH (US)

( * ) Notice: Subject to any disclaimer, the term of this patent is extended or adjusted under 35 U.S.C. 154(b) by 51 days.

(21) Appl. No.: 09/587,101

(22) Filed: Jun. 2, 2000

Related U.S. Application Data

(60) Provisional application No. 60/137,587, filed on Jun. 4, 1999.

(51) Int. Cl.⁷ .............................................. C23C 16/00
(52) U.S. Cl. .................. 118/712; 118/692; 118/715; 118/725; 427/249.2; 427/900; 29/407.08; 29/428
(58) Field of Search .................. 427/249.2, 255.12, 427/900; 29/407.08, 428; 118/692, 712, 715, 725

(56) References Cited

U.S. PATENT DOCUMENTS

| | | | |
|---|---|---|---|
| 3,884,793 A | 5/1975 | Penfold et al. | |
| 3,995,187 A | 11/1976 | Penfold et al. | |
| 4,030,996 A | 6/1977 | Penfold et al. | |
| 4,031,424 A | 6/1977 | Penfold et al. | |
| 4,422,407 A | 12/1983 | Bessot et al. | |
| 4,573,431 A | 3/1986 | Sarkozy | |
| 4,606,650 A | 8/1986 | Harris | |
| 4,609,562 A * | 9/1986 | Isenberg | 118/715 |
| 4,794,220 A | 12/1988 | Sekiya | |
| 4,854,266 A | 8/1989 | Simson et al. | |
| 5,073,241 A | 12/1991 | Watanabe | |
| 5,284,676 A | 2/1994 | Accuntius et al. | |
| 5,470,452 A | 11/1995 | Dickey et al. | |
| 5,480,678 A | 1/1996 | Rudolph et al. | |
| 5,625,170 A | 4/1997 | Poris | |
| 5,725,746 A | 3/1998 | Dickey et al. | |
| 5,738,908 A * | 4/1998 | Rey | 427/249.2 |
| 5,789,026 A * | 8/1998 | Delperier | 427/249.2 |
| 5,853,485 A | 12/1998 | Rudolph et al. | |
| 5,900,297 A | 5/1999 | Rudolph et al. | |
| 6,257,881 B1 * | 7/2001 | Fiala | 118/715 |

FOREIGN PATENT DOCUMENTS

| | | |
|---|---|---|
| EP | 0 410 442 A1 | 1/1991 |
| EP | 0 832 863 A2 | 1/1998 |
| EP | 0 846 787 A1 | 6/1998 |
| WO | WO 95/16803 | 6/1995 |

OTHER PUBLICATIONS

Foreign Search Report, European Patent Office, Sep. 25, 2000.

W.V. Kotlensky, Deposition of Pyrolytic Carbon in Porous Solids, 8 Chemistry and Physics of Carbon, 173, 190–203 (1973).

W.J. Lackey, Review, Status, and Future of the Chemical Vapor Infiltration Process for Fabrication of Fiber–Reinforced Ceramic Composites, Ceram. Eng. Sci. Proc. 10[7–8] 577–81 (1989).

J. Linke et al., Behavior of Boron Doped Graphites, Plasma Sprayed B4C, and a –C/B:H as Plasma Facing Material, Fus. Tech. 20, 228–231, (9/91).

Ponnekanti et al., Failure modes of anodized aluminum parts used in CVD chambers, J. Vac. Sci. Tech. A14(3), (5/96).

\* cited by examiner

*Primary Examiner*—Richard Bueker
(74) *Attorney, Agent, or Firm*—Brinks Hofer Gilson & Lione

(57) ABSTRACT

An apparatus to determine the pressure within the furnace during thermal gradient forced flow processes as well as other CVI/CVD processes is disclosed. Further, a method to measure the pressure is also described.

6 Claims, 2 Drawing Sheets

METHOD AND APPARATUS FOR PRESSURE MEASUREMENT IN A CVI/CVD FURNACE

RELATED APPLICATIONS

This non-provisional application claims the benefit of and incorporates by reference in its entirety U.S. provisional application No. 60/137,587, filed on Jun. 4, 1999.

BACKGROUND OF THE INVENTION

This invention relates to the field of high temperature composites made by chemical vapor infiltration and deposition of a binding matrix within a porous structure. More particularly the invention relates to a method of measuring pressure within a CVI/CVD furnace during a CVI/CVD process, as well as an apparatus to measure pressure within a CVI/CVD furnace.

Chemical vapor infiltration and deposition is a well-known process for depositing a binding matrix within a porous structure. The term chemical vapor deposition, "CVD" generally implies only the deposition of a surface coating. However, the term has also been used to describe not only the deposition but also the infiltration of a matrix within a porous structure. Therefore, for purposes of this application, the term chemical vapor infiltration, "CVI/CVD" is intended to refer to not only the infiltration but also the deposition of a binding matrix within a porous structure. This technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components.

In general, in the CVI/CVD process for carbon deposition, an open or porous structure is exposed to a gas under conditions that decompose or crack the gas into carbon very slowly. The carbon is deposited into a porous structure to form a composite material comprising the porous structure with a matrix filler within the porous structure. In conventional CVI processes, the outside of the porous structure densifies more quickly than the interior of the structure. This densification decreases the porosity of the surface and prohibits the hydrocarbon gas from entering the porous structure. Therefore, the process must be interrupted and the porosity restored by machining the porous structure to remove the occluded surface.

The generally known CVI/CVD processes may be classified into four general categories: isothermal, thermal gradient, pressure gradient, and pulsed flow. See W. V. Kotlensky, Deposition of Pyrolytic Carbon in Porous Solids, 8 Chemistry and Physics of Carbon, 173, 190–203 (1973); W. J. Lackey, Review, Status, and Future of the Chemical Vapor Infiltration Process for Fabrication of Fiber-Reinforced Ceramic Composites, Ceram. Eng. Sci. Proc. 10[7–8] 577, 577–81 (1989). In an isothermal CVI/CVD process, a reactant gas passes around a heated porous structure at absolute pressures as low as a few millitorr. The gas diffuses into the porous structure driven by concentration gradients and cracks to deposit a binding matrix. This process is also known as "conventional" CVI/CVD. Although the process is coined "isothermal" due to the fact that the porous structure is heated to a more or less uniform temperature, this is actually a misnomer. Some variations in temperature within the porous structure are inevitable due to uneven heating (essentially unavoidable in most furnaces), cooling of some portions due to reactant gas flow, and heating or cooling of other portions due to heat of reaction effects. Hence, "isothermal" means that there is no attempt to induce a thermal gradient that preferentially affects deposition of a binding matrix onto the porous structure. This process is well-suited for simultaneously densifying large quantities of porous articles and is particularly suited for making carbon/carbon brake disks. With appropriate processing conditions, a matrix with desirable physical properties can be deposited. However, the conventional CVI/CVD process is a very slow process and may require weeks of continual processing in order to achieve a useful density. Moreover, the surface tends to densify first resulting in "seal-coating" that prevents further infiltration of reactant gas into inner regions of the porous structure and uniform deposition of the matrix material within the porous structure. Thus, this technique generally requires several surface machining operations that interrupt the densification process.

In a thermal gradient CVI/CVD process, a porous structure is heated so that a steep thermal gradient is generated which induces deposition in a desired portion of the porous structure. The thermal gradients may be induced by heating only one surface of a porous structure. For example, the thermal gradient may be generated by placing a porous structure surface against a susceptor wall in an electric induction heated furnace. The gradient created may be further enhanced by cooling an opposing surface, for example by placing the opposing surface of the porous structure against a liquid cooled wall. Deposition of the binding matrix progresses from the hot surface to the cold surface. The equipment for use in a thermal gradient process tends to be complex, expensive, and difficult to implement for densifying relatively large quantities of porous structures.

In a pressure gradient CVI/CVD process, the reactant gas is forced to flow through the porous structure by inducing a pressure gradient from one surface of the porous structure to an opposing surface of the porous structure. The flow rate of the reactant gas is greatly increased relative to the isothermal and thermal gradient processes which results in increased deposition rate of the binding matrix. This process is also known as "forced-flow" CVI/CVD. Conventional prior fixturing for pressure gradient CVI/CVD tends to be complex, expensive, and difficult to implement for densifying large quantities of porous structures. An example of a process that generates a longitudinal pressure gradient along the lengths of a bundle of unidirectional fibers is provided in S. Kamura, N. Takase, S. Kasuya, and E. Yasuda, Fracture Behaviour of C Fiber/CVD C Composite, Carbon '80 (German Ceramic Society) (1980). An example of a process that develops a pure radial pressure gradient for densifying an annular porous wall is provided in U.S. Pat. Nos. 4,212,906 and 4,134,360. The annular porous wall disclosed by these patents may be formed from a multitude of stacked annular disks (for making brake disks) or as unitary tubular structure. For thick-walled structural composites, a pure radial pressure gradient process generates a very large, undesirable density gradient from the inside cylindrical surface to the outside cylindrical surface of the annular porous wall.

Finally, pulsed flow involves cyclically filling and evacuating a chamber containing the heated porous structure with the reactant gas. The cyclical action forces the reactant gas to infiltrate the porous structure and also forces removal of the cracked reactant gas by-products from the porous structure. The equipment to implement such a process is complex, expensive, and difficult to maintain. This process is very difficult to implement for densifying large numbers of porous structure.

The thermal gradient and pressure gradient processes have been combined by many workers resulting in a "thermal gradient-forced flow" process. Combining the processes appears to overcome some of the shortcoming of each of the individual processes and results in very rapid densification of porous structures. However, combining the processes also results in an increase in the complexity of the system since fixturing and equipment must be provided to induce both thermal and pressure gradients with some degree of control. A process for densifying small disks and tubes according to a thermal gradient-forced flow process is disclosed by U.S. Pat. No. 4,580,524; and by A. J. Caputo and W. J. Lackey, Fabrication of Fiber-Reinforced Ceramic Composites by Chemical Vapor Infiltration, Prepared by the OAK RIDGE NATIONAL LABORATORY for the U.S. DEPARTMENT OF ENERGY under Contract No. DE-AD05-840R21400 (1984). According to this process, a fibrous preform is disposed within a water-cooled jacket. The top of the preform is heated and a gas is forced to flow through the preform to the heated portion where it cracks and deposits a matrix. A process for depositing a matrix within a tubular porous structure is disclosed by U.S. Pat. No. 4,895,108. According to this process, the outer cylindrical surface of the tubular porous structure is heated and the inner cylindrical surface is cooled by a water jacket. The reactant gas is introduced to the inner cylindrical surface. Similar thermal gradient-forced flow CVI/CVD processes for forming various articles are disclosed by T. Hunh, C. V. Burkland, and B. Bustamante, Densification of a Thick Disk Preform with Silicon Carbide Matrix by a CVI Process, Ceram. Eng. Sci. Proc. 12[9–10] pp. 2005–2014 (1991); T. M. Besmann, R. A. Lowden, D. P. Stinton, and T. L. Starr, A Method for Rapid Chemical Vapor Infiltration of Ceramic Composites, Journal De Physique, Colloque C5, supplement n°5, Tome 50 (1989); T. D. Gulden, J. L. Kaae, and K. P. Norton, Forced-Flow Thermal-Gradient Chemical Vapor Infiltration (CVI) of Ceramic Matrix Composites, Proc.-Electrochemical Society (1990), 90–12 (Proc. Int. Conf. Chem. Vap. Deposition, 11th, 1990) 546–52.

Fixturing and equipment for the thermal gradient forced flow CVI/CVD process can be complex as explained above since both thermal and pressure gradients must be induced with some degree of control. In order to obtain some degree of control in such devices, it is desirable to know the pressure within the furnace. In particular, it is desirable to be able to determine the pressure within a particular region of the furnace, and more specifically, the pressure near the porous structures themselves. Conventionally, the pressure of the reactant gas was generally measured before it entered the furnace. This pressure was then extrapolated to determine what the pressure in the furnace, near the porous structures, should be. This method is only accurate to within ±25–30%, due to the many unknowns, such as, but not limited to gas temperature and gas velocity through the preheater once the gas enters the furnace. Another way to measure pressure was to lower a pitot static tube into the furnace from a hole in the furnace lid. This method was very labor intensive and time consuming.

Therefore, a method to determine the pressure within the furnace during thermal-gradient forced flow CVI/CVD processes, as well as all other CVI/CVD processes, and apparatus for implementing that method are desired. Preferably this method should give constant, real time pressure readings. In particular, a method is desired to determine the pressure in the furnace very near the porous structures themselves, with enough accuracy to determine if there are pressure leaks before the reactant gas reaches the porous structures. Pressure leaks are not desirable because the deposition rate of the carbon onto the porous structures will be reduced. Furthermore, leaks cause poor gas flow distribution in the furnace and often times lead to sooting. Finally, apparatus for implementing the method is desirable.

SUMMARY OF THE INVENTION

According to an aspect of the invention, apparatus is disclosed for measuring pressure within a susceptor volume, within a CVI/CVD furnace during a CVI/CVD process wherein a reactant gas is introduced into the CVI/CVD furnace via a reactant gas line, and wherein the susceptor volume is bound by susceptor sides, a susceptor lid, and a floor plate, comprising: a pressure indicator tube having two ends, a first end and second end, wherein said first end is in the susceptor volume, and wherein the pressure indicator tube is located inside the reactant gas line; and a pressure indicator located outside of the CVI/CVD furnace, wherein said second end of the pressure indicator tube is connected to the pressure indicator in fluid communication therewith.

DETAILED DESCRIPTION OF THE INVENTION

Figure 1:
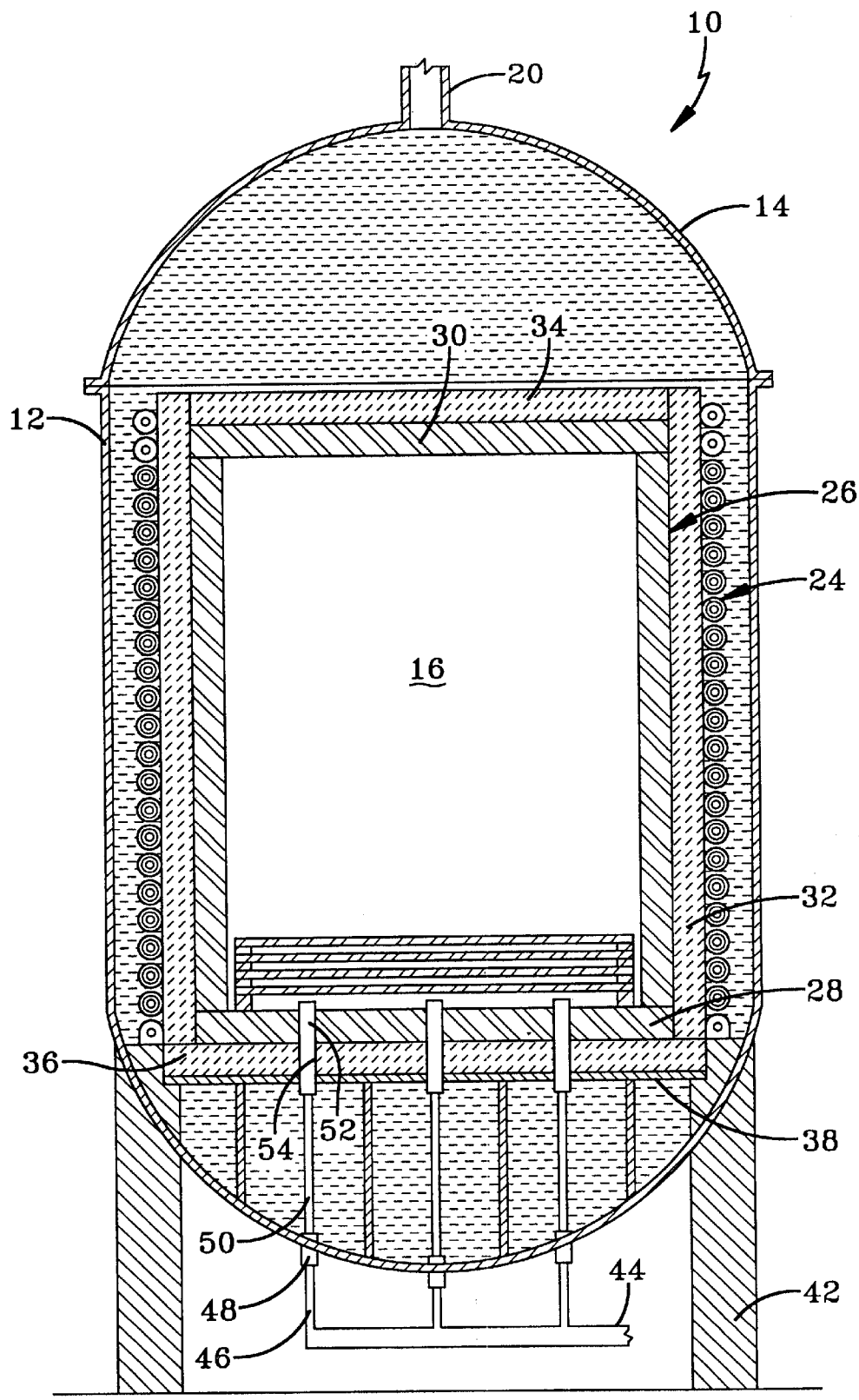
FIG. 1 is a cross-sectional view of a high temperature furnace according to one aspect of the invention.
Figure 2:
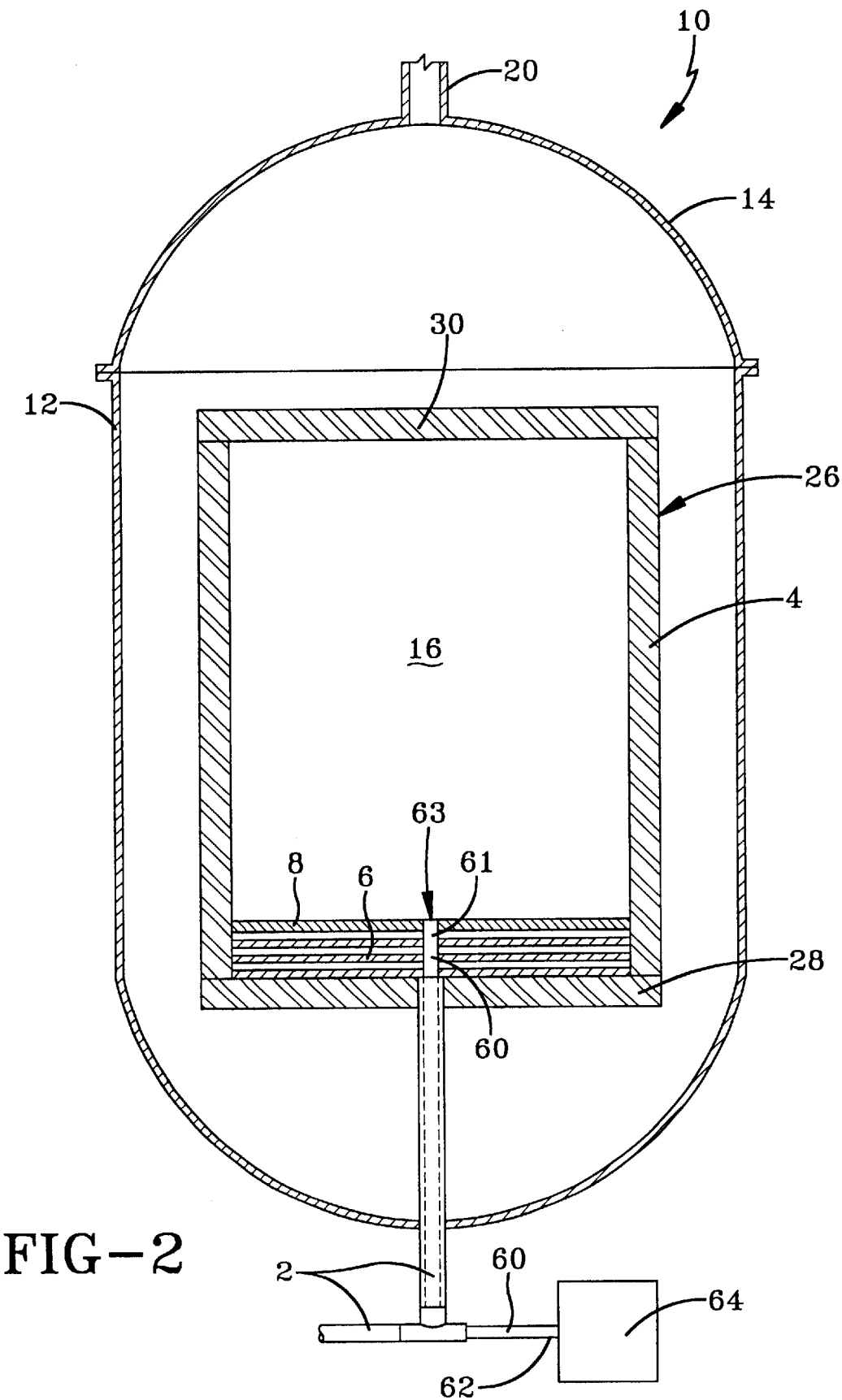
FIG. 2 is a cross-sectional view of a high temperature furnace, according to an aspect of the invention.

Various aspects of the invention are shown in FIGS. 1–2, which are not drawn to scale, and wherein like components are numbered alike. Referring now to FIG. 1, a cross-sectional view of a high temperature furnace 10 is presented, by way of example. This high temperature furnace 10 implements various aspects of the invention. As used herein, the term "high temperature" generally means a temperature substantially elevated above room temperature in the range of 300° C. or greater. Refractory materials, generally, are manufactured and/or processed at temperatures greater than 300° C., and may be on the order of 900°–3000° C., or higher. For example, a porous carbon aircraft brake disk may have a pyrolytic carbon matrix deposited within it by a CVI/CVD process conducted at a temperature in the range of 900°–1100° C., and may further be heat-treated at a temperature up to 2200° C. or higher. Manufacturing and processing other types of ceramic materials may occur at other high, elevated temperatures. Furnaces are commonly configured specifically for processing refractory composite materials using high temperature processes. Such processes include deposition of a binding matrix within a porous substrate, and heat treatment processes wherein refractory composite materials are heated for a defined period of time in order to alter some aspect of the material properties. Such processes are well known in the art.

Again referring to FIG. 1, furnace 10 is generally cylindrical and comprises a steel shell 12 and a steel lid 14. The lid also comprises vacuum port 20. The furnace 10 further comprises a cylindrical induction coil 24 adjacent a cylindrical susceptor 26. During operation, the induction coil 24 develops an electromagnetic field that couples with the susceptor 26 and generates heat within the susceptor 26. The susceptor 26 rests upon a susceptor floor 28 and is covered by a susceptor lid 30. A cylindrical insulation wall 32 is disposed in between the susceptor 26 and the induction coil 24. Lid insulation layer 34 and floor insulation layer 36 are disposed over the susceptor lid 30 and beneath the susceptor floor 28, respectively. A reactant gas is supplied to the furnace 10 by a main gas supply line 44. Any type of reactant gas used in CVI/CVD processes can be used herein, including mixtures of various gases. If mixtures of various gases are desired, a multitude of individual gas supply lines 46 may be connected in fluid communication with a multitude of gas ports 48 that pass through the furnace shell 12. A multitude of flexible gas supply lines 50 are connected in fluid communication with the gas ports 48 and a multitude of gas inlets 52 that pass through holes 54 in the furnace floor 38, the floor insulation layer 36, and the susceptor floor 28.

Referring now to FIG. 2, according to an aspect of the invention, there is an apparatus for measuring pressure within a susceptor volume 16, within a CVI/CVD furnace 10 having a furnace shell 12. Such an apparatus can be used during thermal gradient forced flow CVI/CVD process, for example. A reactant gas is introduced into the CVI/CVD furnace 10 via a reactant gas line 2 which passes through the furnace shell 12, and wherein the susceptor volume 16 is bounded by susceptor sides 4, a susceptor lid 30, and a floor plate 8. This floor plate 8 is above a preheater 6. The apparatus for measuring pressure comprises: a pressure indicator tube 60 having two ends, a first end 61 and a second end 62, wherein the first end 61 is in said susceptor volume 16, and wherein a portion of the pressure indicator tube 60 is located inside a portion of the reactant gas line 2 which passes through the furnace shell 12. The apparatus includes a pressure indicator 64 located outside of the CVI/CVD furnace, wherein the second end 62 of the pressure indicator tube 60 is connected to the pressure indicator 64 in fluid communication therewith. The pressure indicator can be any type of pressure indicator. Preferably, a standard electronic vacuum transmitter calibrated from 0–100 mm. mercury (Hg.) absolute with linear output is used as the pressure indicator.

In a preferred embodiment of the invention, the pressure indicator tube 60 is a graphite tube. In a further preferred embodiment, the first end 61 of the pressure indicator tube has a face 63 which is in the susceptor volume 16, and such face 63 is turned away from the flow of the reactant gas flow. In a more specific embodiment, the face 63 of the first end 61 is flush with the floor plate 8. In yet another embodiment of this invention, the pressure indicator tube 60 passes through the furnace shell 12 where it is directly connected with pressure indicator 64.

According to a further aspect of the invention, referring again to FIG. 2, there is an apparatus for measuring pressure within a susceptor volume 16, within a CVI/CVD furnace 10. This embodiment includes a susceptor volume 16 bounded by susceptor sides 4, a susceptor lid 30, and a floor plate 8, comprising: a pressure indicator tube 60 having two ends, a first end 61 and second end 62, wherein the first end 61 has a face 63 which is in the susceptor volume 16. The apparatus further includes a pressure indicator 64 located outside of the CVI/CVD furnace 10. The second end 62 of the pressure indicator tube 60 is connected to the pressure indicator 64 in fluid communication therewith. In a preferred embodiment, the face 63 of the first end 61 is flush with the floor plate 8. In a further preferred embodiment, the pressure indicator tube 60 is a graphite tube.

According to yet a further aspect of the invention, there is a method for measuring pressure within a susceptor volume 16, within a CVI/CVD furnace 10 having a furnace shell 12. A susceptor volume 16 is bounded by susceptor sides 4, a susceptor lid 30, and a floor plate 8, within the furnace shell. The method comprises the steps of passing a pressure indicator tube 60 having two ends, a first end 61 and second end 62, through the furnace shell 12 such that the first end 61 is in the susceptor volume 16, and the first end 61 has a face 63. The second end 62 is located outside the furnace 10. The second end 62 is connected to a pressure indicator 64 located external to the furnace 10, such that the pressure indicator tube 60 is in fluid communication with the pressure indicator 64. In a further embodiment of this invention, the face 63 of first end 61 should be flush with the floor plate 8. In another preferred embodiment, the pressure indicator tube 60 is a graphite tube. The data collected from the pressure measuring device can be stored and trended in real time if desired. The operator of the furnace can then review this data to determine if a leak has occurred. Similarly, more than one pressure indicator tube and indicator can be used in the CVI/CVD furnace. The tubes can be routed to the same indicator or to individual indicators as desired.

According to a further aspect of the invention, there is a method for measuring pressure within a susceptor volume 16, within a CVI/CVD furnace 10 during a CVI/CVD process wherein a reactant gas is introduced into the CVI/CVD furnace 10 via a reactant gas line 2, and wherein the susceptor volume 16 is bounded by susceptor sides 4, a susceptor lid 30, and a floor plate 8, comprising the steps of passing a pressure indicator tube 60 having two ends, a first end 61 and a second end 62, through the reactant gas line 2, such that the first end 61 is in the susceptor volume 16; and, connecting the second end 62 to a pressure indicator 64 located external to the CVI/CVD furnace 10, such that the pressure indicator tube 60 is in fluid communication therewith. The tubes can be routed to the same indicator or individual indicators.

What is claimed is:

1. Apparatus for measuring pressure within a susceptor volume, within a CVI/CVD furnace having a furnace shell, during a CVI/CVD process wherein a reactant gas is introduced into the CVI/CVD furnace via a reactant gas line which passes through the furnace shell, and wherein the susceptor volume is bounded by susceptor sides, a susceptor lid, and a floor plate, comprising:

a pressure indicator tube having two ends, a first end and a second end, wherein said first end is in said susceptor volume, and wherein a portion of said pressure indicator tube is located inside the portion of said reactant gas line which passes through the furnace shell; and a pressure indicator located outside of said CVI/CVD furnace, wherein said second end of said pressure indicator tube is connected to said pressure indicator in fluid communication therewith.

2. Apparatus of claim 1, wherein said pressure indicator tube is a graphite tube.

3. Apparatus of claim 1, wherein the first end has a face which is in said susceptor volume, and said face is not facing the reactant gas flow.

4. Apparatus of claim 1, wherein said pressure indicator tube passes out through the bottom of said CVI/CVD furnace.

5. Apparatus of claim 1, wherein said face of said first end of said pressure indicator tube is flush with said floor plate.

6. Method for measuring pressure within a susceptor volume, within a CVI/CVD furnace during a CVI/CVD process wherein a reactant gas is introduced into the CVI/CVD furnace via a reactant gas line, and wherein the susceptor volume is bounded by susceptor sides, a susceptor lid, and a floor plate, comprising the steps of:

passing a pressure indicator tube having two ends, a first end and a second end, through said reactant gas line, such that the first end is in said susceptor volume; and connecting said second end to a pressure indicator located external to said CVI/CVD furnace, such that said pressure indicator tube is in fluid communication therewith.

* * * * *